US006608481B1

(12) United States Patent
Piazza et al.

(10) Patent No.: US 6,608,481 B1
(45) Date of Patent: Aug. 19, 2003

(54) POLE OF A CIRCUIT BREAKER WITH AN INTEGRATED OPTICAL CURRENT SENSOR

(75) Inventors: Costante Piazza, Lodi (IT); Emiliano Centenaro, Pavia (IT); Philippe Gabus, Birmenstorf (CH); Klaus Bohnert, Oberrohrdorf (CH); Hubert Braendle, Oberengstringen (CH); Roberto Cameroni, Milan (IT)

(73) Assignee: ABB T & D Technology Ltd., Zurig (CH)

( * ) Notice: Subject to any disclaimer, the term of this patent is extended or adjusted under 35 U.S.C. 154(b) by 0 days.

(21) Appl. No.: 09/744,953

(22) PCT Filed: Aug. 5, 1999

(86) PCT No.: PCT/EP99/05750

§ 371 (c)(1),
(2), (4) Date: Feb. 21, 2001

(87) PCT Pub. No.: WO00/08664

PCT Pub. Date: Feb. 17, 2000

(30) Foreign Application Priority Data

Aug. 6, 1998 (IT) ........................................ MI98A1859

(51) Int. Cl.[7] ........................ G01R 31/02; H01H 33/88
(52) U.S. Cl. ........................................ 324/424; 218/63
(58) Field of Search ....................... 324/424, 96, 117 R, 324/127, 418; 218/63

(56) References Cited

U.S. PATENT DOCUMENTS

| | | | | | |
|---|---|---|---|---|---|
| 3,324,393 | A | * | 6/1967 | Casey et al. | 324/96 |
| 3,686,567 | A | * | 8/1972 | Orgeret | 324/96 |
| 5,223,682 | A | * | 6/1993 | Pham et al. | 218/63 |
| 5,764,046 | A | * | 6/1998 | Bosselmann | 324/96 |

FOREIGN PATENT DOCUMENTS

| | | | |
|---|---|---|---|
| EP | 0537074 | * | 4/1993 |
| FR | 2731520 | * | 9/1996 |

* cited by examiner

*Primary Examiner*—N. Le
*Assistant Examiner*—James C Kerveros
(74) *Attorney, Agent, or Firm*—Oblon, Spivak, McClelland, Maier & Neustadt, P.C.

(57) ABSTRACT

A pole of a high- and/or medium-voltage circuit breaker, including an insulating housing, at least one, interruption chamber which is positioned inside the insulating housing and contains at least a moving contact and at least a fixed contact. A device for measuring the electric current flowing through the pole, and a dielectric gas, the particularity of which is the fact that said device for measuring the electric current flowing through the pole includes an optical current sensor arranged within a volume of the pole that is occupied by the dielectric gas.

18 Claims, 10 Drawing Sheets

POLE OF A CIRCUIT BREAKER WITH AN INTEGRATED OPTICAL CURRENT SENSOR

BACKGROUND OF THE INVENTION

The present invention relates to a pole of a circuit breaker for high- and/or medium-voltage transmission and/or distribution grids, i.e. for voltages greater than 1000 Volt, which comprises a current measuring sensor which is integrated in its structure and is realized by means of optical technologies. The pole according to the present invention is now described with reference to a pole of a high-voltage circuit breaker without thereby limiting in any way the scope of its application.

It is known that current measurements are usually performed in a pole of a high-voltage circuit breaker in order to ensure adequate control of said circuit breaker. Current measurements are generally performed by using measurement poles which are known in the art as current transformers. These measurement poles generally comprise windings on a core made of magnetic material and supporting and insulation structures. Said current measurement poles can be of various kinds and are used according to particular configurations which are described hereinafter.

A first configuration of current transformers is the one known in the state of the art as stand-alone transformer.

FIG. 1 schematically illustrates an example of a current transformer which is generally used in said configuration.

The transformer is mainly constituted by three structural components: an insulator 1, generally constituted by a finned tube made of polymeric material or porcelain; a head 2, made of aluminum or steel; and a base 3 which is also made of aluminum or steel and constitutes the structure for anchoring to a supporting surface, for example a supporting pillar.

The primary winding 5 of the transformer is positioned inside the head 2, as shown in FIG. 1, and is constituted by a through bar 6 which is arranged horizontally and fixed to the head 2 in a suitable manner.

The secondary windings 8 of the transformer are arranged inside some toroidal shields 7 and are supported by a supporting tube 9 which is fixed by means of its lower end to the base 3 of the transformer. Inside the tube 9, conductors 10 from the secondary windings 8 are conveyed and connected, at their terminals, to a terminal box 11 which is arranged at the base 3 of the transformer. A flange 12 between the base 3 and the insulator 1 has holes 13 which are required for the passage of the conductors 10 and for introducing the dielectric gas that arrives from a filling valve (not shown in the figure;) provided in the base 3. The dielectric gas can be constituted, for example, by sulfur hexafluoride ($SF_6$), nitrogen or a mixture of the two gases.

The above described current transformer has several problems due to the use of a transformer having a magnetic core.

Under high currents the magnetic core of the transformer is in fact affected by saturation effects which compromise the current measurement to be performed. These effects force to model the transformer core according to the intensity of the currents to be measured and to the precision with which the measurement is to performed. This entails considerable engineering problems and high manufacturing costs.

Further disadvantages arise from the fact that windings with a magnetic core generally have a limited frequency band and are potentially sensitive to external electromagnetic interference.

These disadvantages lead to high production and operating costs which increase as the operating voltages rise, due to the need to use high-quality magnetic cores in order to ensure adequate repeatability of the performance of the measurement pole.

The stand-alone transformer configuration has, as described hereinafter, considerable problems in terms of bulk and high costs both during installation and during operation.

FIG. 2 is a schematic view of an example of use of said stand-alone transformer configuration in a high-voltage substation in which the pole shown in FIG. 1 can be used as a current transformer.

The line current flows, for example in the direction of the arrow 24, across a disconnector 20 to a circuit breaker 1 and from there to a current transformer 22, already described in FIG. 1. Access to the remaining part of the substation is gained by means of the disconnector 23.

The current transformer 22 can be arranged both upstream and downstream of the circuit breaker 21 but in any case it is arranged outside the circuit breaker 21. In order to ensure adequate insulation for each electrical pole of the line the transformer 22 must be placed on a separate support and located at a suitable distance from the circuit breaker 21. This entails a considerable overall space occupation of the substation. This fact leads to high installation and operating costs. The plurality of different and separate functional elements inside the substation furthermore entails considerable problems in terms of maintenance and reliability.

FIG. 3 is a schematic view of an example of configuration in which integration between the circuit breaker and the current transformer is provided in a single pole. In particular, as described in FIG. 3, said integration is performed inside the body of the circuit breaker. The circuit breaker/current transformer assembly is mainly constituted by three parts, respectively an interruption chamber 30, shown partially in FIG. 3, a region 31 which accommodates primary windings and secondary windings 34 of the transformer (provided on a magnetic core), an insulator 33 and a housing 32 which accommodates means 35 for the actuation of the moving contact of the circuit breaker and secondary terminals 36 of the transformer. Conductors 37 which protrude from the windings 34 are conveyed through a metal tube 38 located inside the insulator 33 to the secondary terminals 36. Said metal tube 38 also accommodates a rod 39 for actuating a moving contact 40 of the circuit breaker. The primary current flows from the moving contact 40 to an external primary contact 41 which is located at the region 31 that accommodates the windings 34.

Although the pole of FIG. 3 advantageously mutually integrates the current measurement pole and the circuit breaker, it still uses current transformers wound on a magnetic core. In this configuration as in others which can be found in the art, the technological problems arising from the use of these components therefore remain. As described earlier, said technological problems are essentially the large space occupation and high costs of the windings and the non-ideal magnetic behavior of the core of these transformers.

There are other known poles which allow to solve the problems that arise from the use of windings on magnetic cores. These poles use optical technologies and are based on the measurement of the rotation of the polarization plane of a light wave which propagates through a transmission medium in the presence of a magnetic field. The rotation is proportional to the intensity of the magnetic field. This property is commonly known as Faraday effect. For the sake of descriptive simplicity, poles of this type are termed hereinafter "optical current sensors". FIG. 4 schematically illustrates a first known constructive example of optical current sensor.

An optical fiber 53 is wound on a suitable support (not shown in the figure) around a primary conductor 51 through which there flows a current (represented by the arrow 52) to be measured. A control system 54 sends a light wave (represented by the arrow 55) which travels along the optical fiber 53. Along its path, the light wave 55 emitted by the control system 54 is influenced by the magnetic field (represented by the dashed arrow 50) generated by the current 52. Said light wave 55 returns to the control system 54 with its polarization angle rotated by a certain extent. The control system 54 measures this rotation. As already noted the extent of this rotation is proportional to the magnetic field 50 and therefore to the current 52 that flows along the primary conductor. The sensitivity of the optical sensor according to this embodiment depends essentially on the number of turns of the optical fiber 53 around the primary conductor. The behavior of the sensor is independent of the geometry of the turns of said optical fiber.

Another known constructive example of optical current sensor is presented in FIG. 5. According to this embodiment, the transmission medium used is a crystal 56 having a suitable geometry and arranged so as to encircle the primary conductor 51 like a ring. A control system 57 emits a light wave (represented by the arrow 58) which, by means of a system of optical fibers 59, reaches the crystal 56. Inside the crystal 56, the light wave 58 undergoes a series of reflections which make said light wave 58 travel along a path around the primary conductor 51 until it returns through the optical fiber system 59 to the control block 57, which measures the rotation of the polarization plane of the light wave 58. This rotation is due to the presence of the magnetic field 50 generated by the current 52 to be measured. As in the example of FIG. 4, the extent of said rotation is proportional to the intensity of the magnetic field 50 and therefore to the intensity of the current 52.

With respect to the preceding embodiment, this one is less used because the sensitivity of the sensor can be increased only by increasing the number of internal reflections of the light wave 58 and therefore the dimensions of the crystal 56. This fact can cause, beyond a certain limit, considerable problems in manufacturing said crystal 58. The embodiment of FIG. 5 is therefore used for measuring relatively high currents, for example above 2000 amperes.

There are many known configurations alternative to the ones shown in FIGS. 4 and 5 for optical current sensors.

There are, for example, known embodiments which use multiple light waves which propagate along the same fiber or crystal in opposite directions. These embodiments are particularly advantageous in that they considerably improve the precision and sensitivity of the measurement system.

Optical current sensors generally have a high linearity even for very wide current ranges. Accordingly, they allow to advantageously solve the saturation problems that are characteristic of current transformers which have windings on a magnetic core. Furthermore, the use of optical materials such as fibers or crystals allows to ensure adequate insulation while maintaining compact dimensions.

Another advantage is constituted by the fact that optical sensors, especially those that use an optical fiber as a transmission medium for the light wave, can have highly variable geometries while maintaining their functionality unchanged.

Another advantage is constituted by the fact that with optical current sensors it is possible to measure AC and DC currents with the same pole.

Furthermore, the considerable development of technologies for manufacturing optical fibers and crystals allows a high degree of industrial repeatability of these sensors at competitive manufacturing prices.

As in the case of current transformers which comprise windings on a magnetic core, optical current sensors are used to measure currents in electric power transmission and/or distribution systems.

FIG. 6 schematically illustrates a constructive example of a high-voltage pole which uses optical sensors to measure the line current. As shown, a circuit breaker 60 is mounted on a support 61. The line current (represented by the arrow 62) flows in a suitable conductor 64 from the circuit breaker 60 toward a measurement probe 63 which is mounted externally with respect to the structure of the circuit breaker 60 and is insulated from it by means of a retention ring 65 which prevents the escape of the dielectric gas (for example $SF_6$) from the circuit breaker 60.

The conductor 64 passes through a region in which the optical current sensor 66 is placed so as to be crossed by the conductor 64 in the manner described above in FIGS. 4 and 5.

Two optical fibers 67 protrude from the optical sensor 66 and are connected to a control block 68 which contains light emitting means 69, light receiving means 70, and a processing block 71. Said processing block 71, in addition to controlling the light emitting means 69 and the light receiving means 70, measures the rotation of the polarization plane of the light transmitted along the fibers 67 by the magnetic field generated by the current 62.

Alternative configurations exist for the use of optical current sensors in poles of high-voltage circuit breakers. However, in the current state of the art said optical sensors are always placed in structures located externally with respect to the circuit breaker, as shown in FIG. 6, or in configurations of the stand-alone transformer type, similar to the one shown in FIG. 7.

With reference to said FIG. 7, an optical sensor 730 is mounted externally with respect to the body of a circuit breaker 740 at one of the main current conductors (designated by the arrow 750).

A cable 760 descends along an insulator 770 which is required to provide the adequate spacing between the current conductor 750 and the ground plane which is rigidly coupled to the processing electronics 780. The insulator 770 is also used to protect the optical cable 760 against the effects of weather. As an alternative, the current sensor can be arranged at the other current conductor 790.

One disadvantage of these embodiments is the need to use, for current measurement, elements which are external to the structure of the circuit breaker. This entails the need to use external supports and protections (for example supporting columns and/or insulators), consequently increasing the dimensions and therefore the manufacture and installation costs, as described above with respect to the embodiment of FIG. 2.

Furthermore, the use of several structural elements increases maintenance problems and decreases the reliability of the system.

SUMMARY OF THE INVENTION

The aim of the present invention is to provide a pole of a high- and/or medium-voltage circuit breaker which comprises a pole for measuring current which allows to perform very accurate measurements and allows a considerable reduction in space occupation.

Within the scope of this aim, an object of the present invention is to provide a pole of a high- and/or medium-voltage circuit breaker which comprises a current measurement pole in which current measurement occurs without having the non-ideal conditions typical of current measurements performed by means of windings on a core of magnetic material.

Another object is to provide a pole of a high- and/or medium-voltage circuit breaker which comprises a current measurement pole in which the insertion of said pole entails a reduced number of components required for the practical execution of the structure of said circuit breaker.

Another object of the present invention is to provide a pole of a high- and/or medium-voltage circuit breaker in which the insertion of a current measurement pole entails a reduced number of mechanical processes to be performed in order to produce the structure in practice.

Another object of the present invention is to provide a pole of a high- and/or medium-voltage circuit breaker in which the insertion of a current measurement pole entails a reduced number of electrical connections to be performed for the operation of said pole.

Another object of the present invention is to provide a pole of a high- and/or medium-voltage circuit breaker in which the step for the assembly of said current measurement pole can be performed simply and quickly.

Another object of the present invention is to provide a pole of a high- and/or medium-voltage circuit breaker which is highly reliable and at competitive costs. This aim, these objects and others which will become apparent hereinafter are achieved by a pole of a high- and/or medium-voltage circuit breaker, comprising an insulating housing, at least one interruption chamber which is positioned inside the insulating housing and contains at least a moving contact and at least a fixed contact, a device for measuring the electric current flowing through the pole, and a dielectric gas, characterized in that said device for measuring the electric current flowing through the pole comprises an optical current sensor arranged within a volume of the pole that is occupied by the dielectric gas.

Preferably, the optical current sensor is placed inside the structure of the interruption chamber of the circuit breaker.

In the pole according to the invention, the use of an optical current sensor ensures that the measurement of the electric current occurs accurately, without having the non-ideal conditions typical of known poles which use windings on a magnetic core.

Thanks to the insertion of the optical current sensor in the volume of the pole that contains the dielectric gas, and particularly inside the structure of the interruption chamber, the pole according to the invention allows to considerably reduce space occupation, using a reduced number of components and electrical connections required for its operation.

The pole according to the invention is furthermore very easy to assemble, does not require particular mechanical processes for its manufacture, is highly reliable and has relatively low manufacturing costs.

BRIEF DESCRIPTION OF THE DRAWINGS

Further characteristics and advantages of the invention will become apparent from the description of some preferred but not exclusive embodiments of a pole of a high- and/or medium-voltage circuit breaker, illustrated only by way of non-limitative example in the accompanying drawings, wherein.

DETAILED DESCRIPTION

A first preferred embodiment of a high-voltage electric pole according to the invention is described with reference to FIGS. 8–10.

The pole according to the invention comprises an insulating housing 81, an interruption chamber 80 (shown partially in FIG. 8) which is positioned inside said insulating housing 81 and contains at least a fixed contact and at least a moving contact, and a housing 82 connected at the base of the insulating housing 81. The interruption chamber 80, the insulator 81 and the housing 82 are filled with a dielectric gas, for example $SF_6$.

Figure 1:
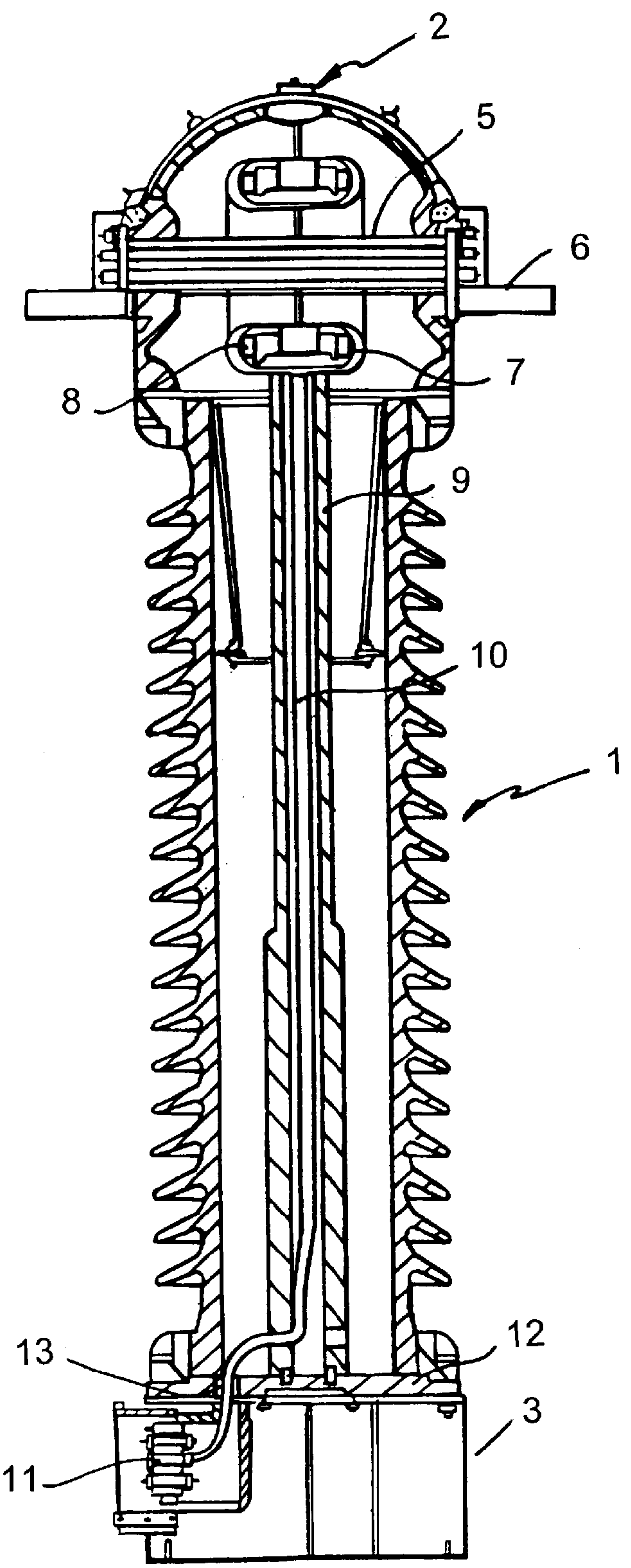
FIG. 1 PRIOR ART
FIG. 1 is a schematic view of a current transformer used in a high-voltage pole executed according to a known configuration.
Figure 2:
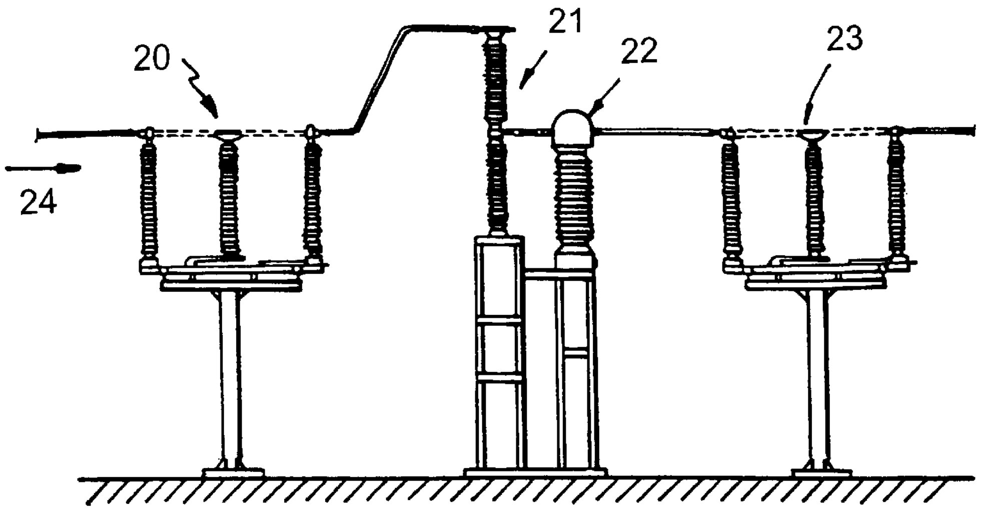
FIG. 2 PRIOR ART
FIG. 2 is a schematic view of a constructive example of the known configuration of FIG. 1 used in a substation for high-voltage grids.
Figure 3:
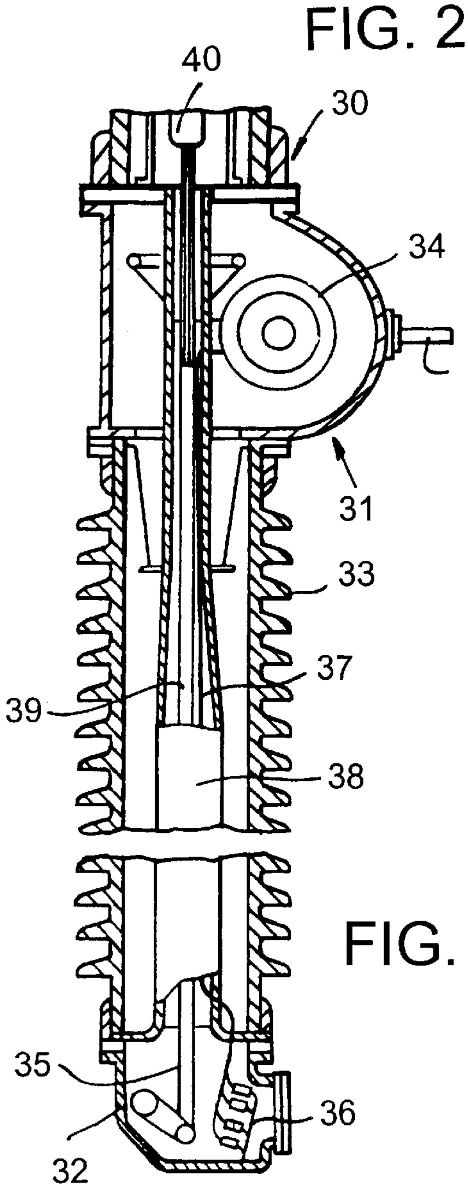
FIG. 3 PRIOR ART
FIG. 3 is a schematic view of a pole of a circuit breaker realized according to a further known configuration.
Figure 4:
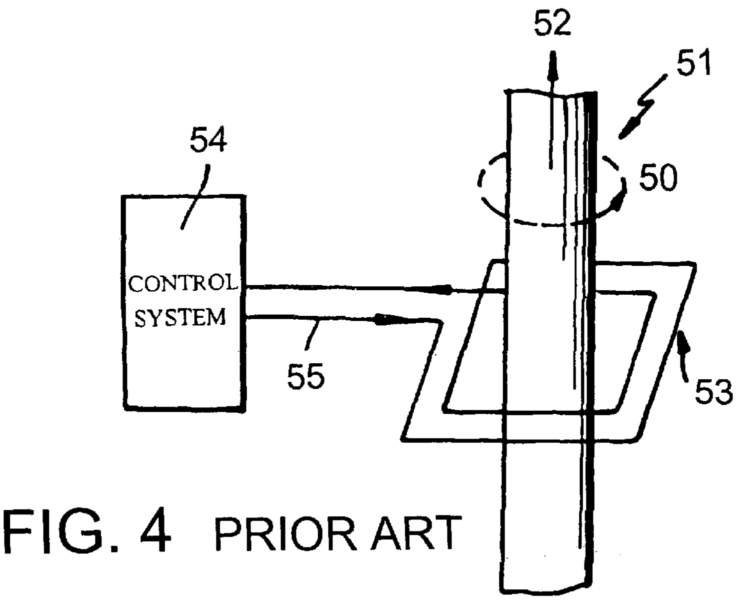
FIG. 4 PRIOR ART
FIG. 4 is a schematic view of a known example of an optical current sensor.
Figure 5:
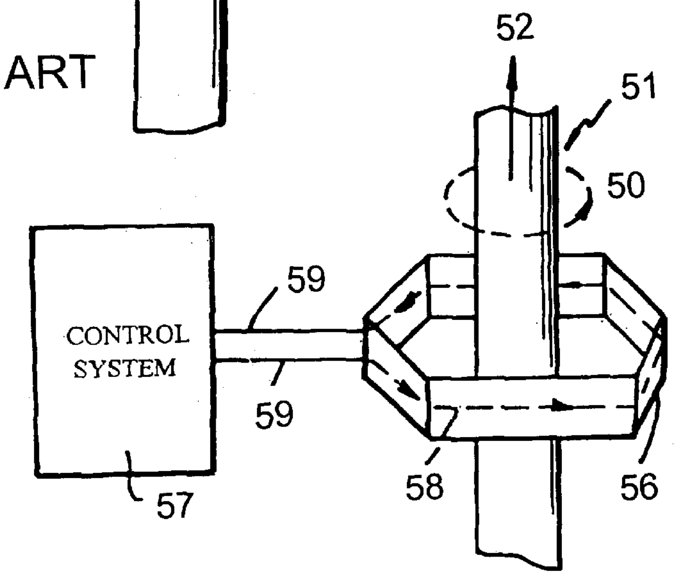
FIG. 5 PRIOR ART
FIG. 5 is a schematic view of another known example of an optical current sensor.
Figure 6:
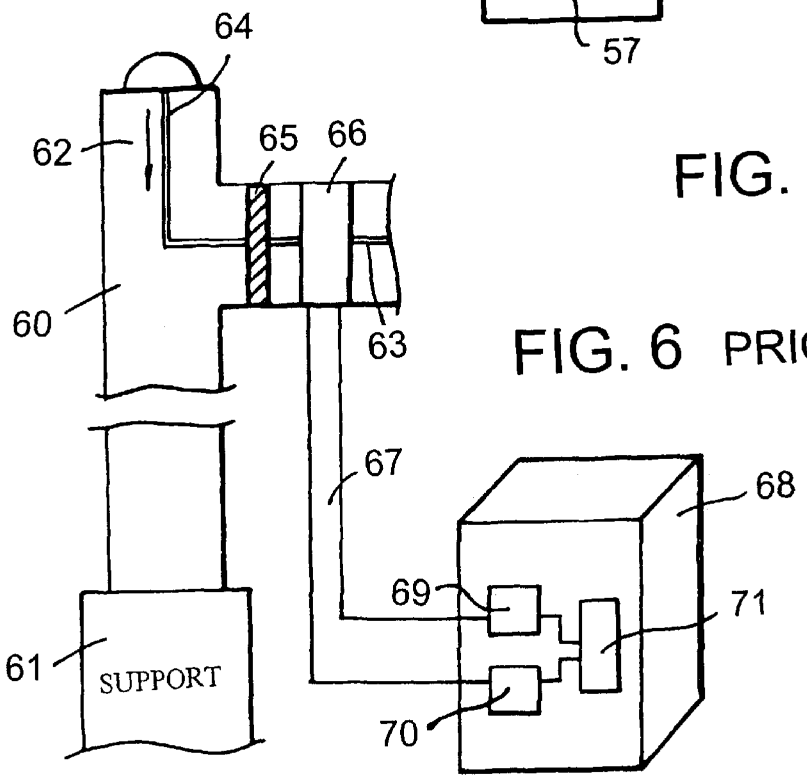
FIG. 6 PRIOR ART
FIG. 6 is a schematic view of a known example of the use of an optical current sensor in a high-voltage pole.
Figure 8:
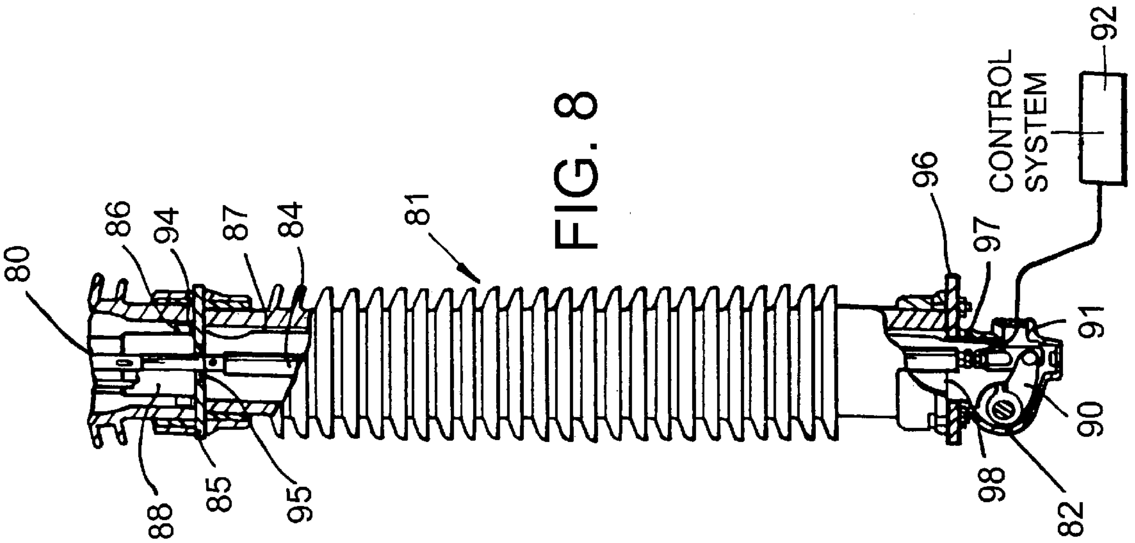
FIG. 8 is a partially sectional view of an example of a first embodiment of the pole according to the invention.
Figure 7:
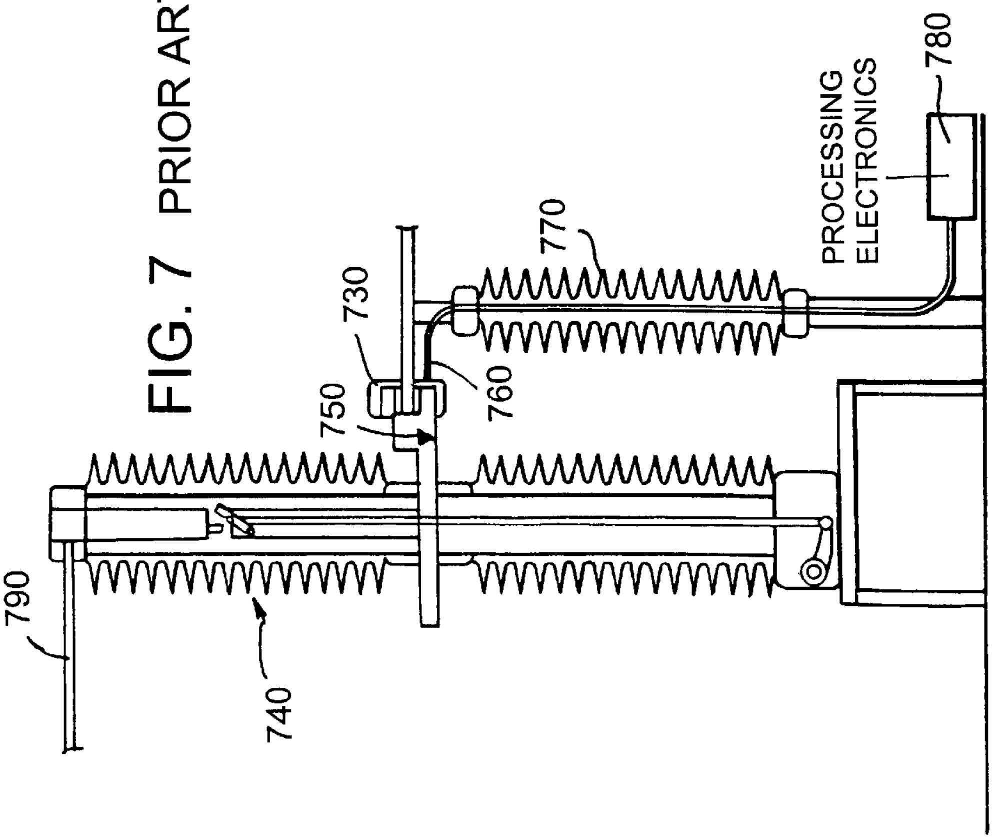
FIG. 7 PRIOR ART
FIG. 7 is a schematic view of another known example of the use of an optical current sensor in a high-voltage pole.

The interruption chamber 80 accommodates an actuation rod 84 for the moving contact of the circuit breaker (not shown in FIG. 8). The interruption chamber 80 furthermore accommodates a collector 88 which is arranged rigidly with respect to a flange 85. An optical current sensor 86 is placed on said flange 85 and around the collector 88; its arrangement is described in detail hereinafter. A transmission cable 87, preferably a transmission optical cable containing one or more optical fibers positioned in a protective means, protrudes from the optical sensor 86 and is conveyed toward the housing 82 through a through hole 94 formed in the flange 85. Said flange 85 furthermore has a through hole 95 for the passage in the interruption chamber 80 of the actuation rod 84 of the moving contact and of the dielectric gas. The collector 88 is arranged so that it is entirely comprised within the optical sensor 86. The current therefore flows from the moving contact of the circuit breaker along the collector 88 up to the flange 85 and is conveyed from there to the outside by means of a suitable terminal, not shown in the figures. By virtue of the arrangement chosen for the optical current sensor 86 and for the current collector 88, the path of the current of the circuit breaker lies entirely inside the optical sensor 86. The electrical insulation between the sensor 86 and the collector 88 is ensured by virtue of the type itself of the sensor used.

The optical cable 87 is conveyed into the insulator 81, which also accommodates the actuation rod 84 of the moving contact of the circuit breaker. The cable 87 accesses the housing 82 (in which elements 90 for moving the actuation rod 84 are arranged) through a flange 96 which has a through hole 97 for fixing the cable 87 and a through hole 98 for the passage of the actuation rod 84.

The optical cable 87 then passes through a partition 91 and accesses a control system 92; the partition 91 is conceived so as to ensure the hermetic containment of the dielectric gas. The control system 92 can be arranged in an additional chamber (not shown in FIG. 8) which is rigidly coupled to the body of the circuit breaker and optionally also filled with a dielectric gas or, according to other preferred embodiments, lies outside the body of the circuit breaker, in a seat which can be arranged even at a relatively large distance from the circuit breaker, thus providing a remote-type control.

Figure 9:
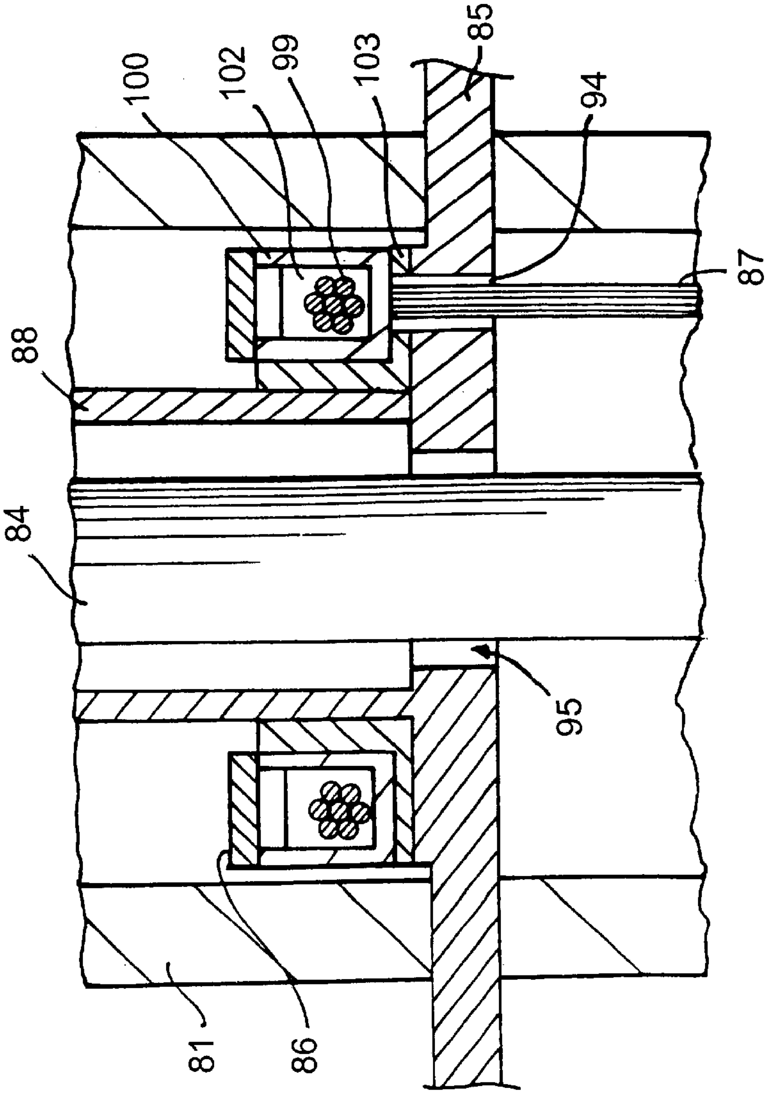
FIG. 9 is a view of a constructive detail of the embodiment according to the invention shown in FIG. 8.

As illustrated in FIG. 9, the optical sensor 86 comprises, as transmission medium, an optical fiber 99 which is wound in one or more turns around the current collector 88 inside a suitable seat 100: alternatively, it is possible to use, as transmission medium, an optical crystal arranged so as to encircle the collector 88. The seat 100 is arranged around the current collector 88 on the flange 85 and is mechanically isolated from the collector 88 and from said flange 85 by means of an insulating layer of suitable material, for example Poron.

Inside the seat 100, the optical fiber 99 is immersed in an insulating and supporting layer 102 (for example made of silicone).

The seat 100 is preferably made of non-conducting material in order to avoid the formation of surface parasitic currents.

The optical fiber 99 is connected to the optical cable 87 by means of a connector 103 which accesses, by means of the through hole 94, the inside of the insulating housing 81.

According to a preferred embodiment, the optical cable 87 contains both ends of the fiber 99 inside an external protective covering made of high-density plastic material for example kynar.

Figure 10:
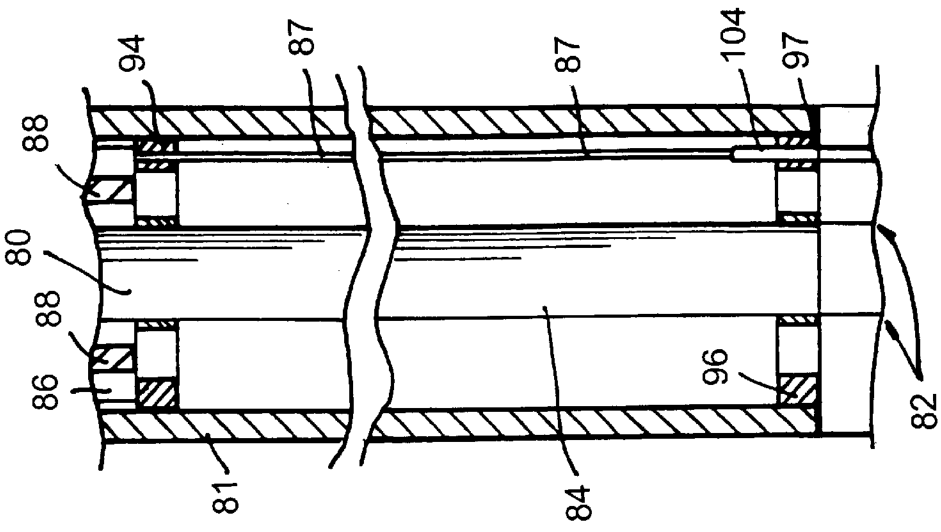
FIG. 10 is a view of another constructive detail of the embodiment according to the invention shown in FIG. 8.

As illustrated in FIG. 10, the optical cable 87 accesses, by means of the through hole 94, the inside of the insulating housing 81 until it reaches the flange 96 that separates the insulating housing 81 from the housing 82. By means of the through hole 97, the cable 87 accesses the housing 82. Before reaching the through hole 97, the cable 87 is inserted in a protective sheath 104, made for example of metallic material, which is also used to fix the cable 87.

Figure 11:
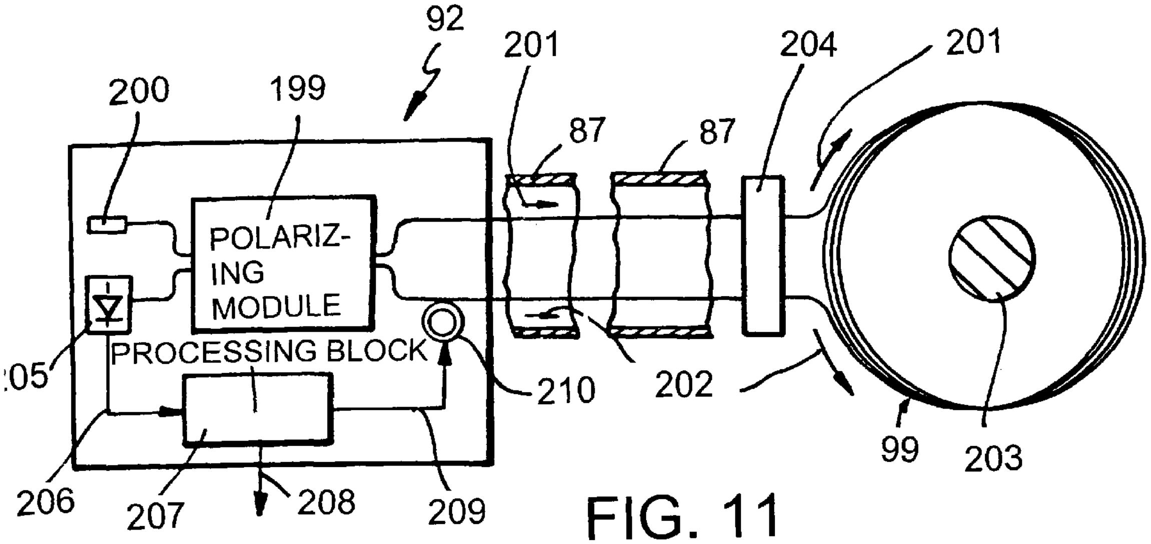
FIG. 11 is a block diagram of the control system of the optical current sensor used in the pole according to the invention.

FIG. 11 illustrates an embodiment according to the invention of the control system 92 of FIG. 8.

According to this preferred but not exclusive embodiment, a light source 200 sends to the two ends of the optical fiber 99 two light waves which travel in the directions indicated by the arrows 201 and 202. The planar polarization of the waves 201 and 202 occurs by means of a polarizing module 199. The optical fiber 99 runs along the optical cable 87 and is wound around a current conductor 203. The light waves 201 and 202, before beginning their loop around the conductor 203, are subjected to circular polarization by means of a polarization pole 204. Along its path around the conductor 203, each wave acquires a phase delay which depends on the current that flows through the conductor 203. Owing to the opposite directions of travel along the fiber, the respective phase delays of the waves 201 and 202 have opposite signs: this causes an increase in the phase shift between the two light waves, consequently increasing the sensitivity of the measurement.

At the end of the loop around the conductor 203, the waves 201 and 202 are converted again with a linear polarization by means of the pole 204 and access the block 199, which transmits them to a receiver 205. Said receiver 205 measures the phase shift between the two light waves and provides an electric signal 206 which is proportional thereto to a processing block 207 which provides in output a measurement signal 208. The processing block 207 also sends a control signal 209 to a phase modulator 210 which closes a feedback cycle inside the system, improving its control.

Figure 12:
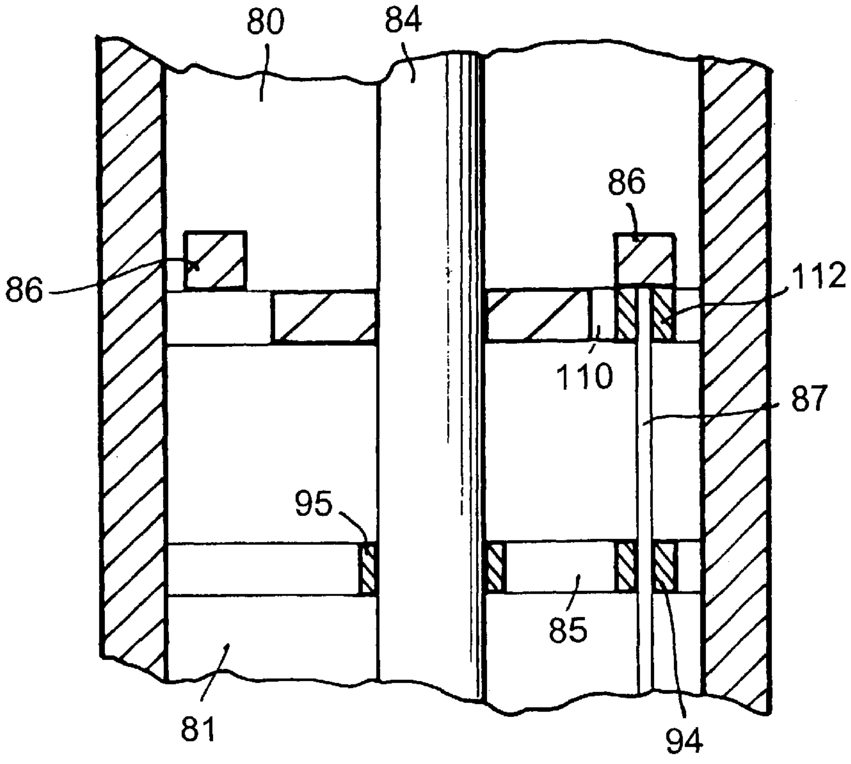
FIG. 12 is a schematic view of another embodiment of the pole according to the invention.

FIG. 12 schematically illustrates an alternative arrangement of the optical current sensor in the pole according to the invention. Accordingly, the optical current sensor 86 is not arranged on the flange 85 between the interruption chamber 80 and the insulating housing 81 of the circuit breaker, but is arranged on a supporting ring 110 which, by virtue of its geometry, can be arranged in any position along the interruption chamber 80. The flange 85 and the ring 110 respectively have through holes 94 and 112 for the passage of the optical cable 87.

Figure 13:
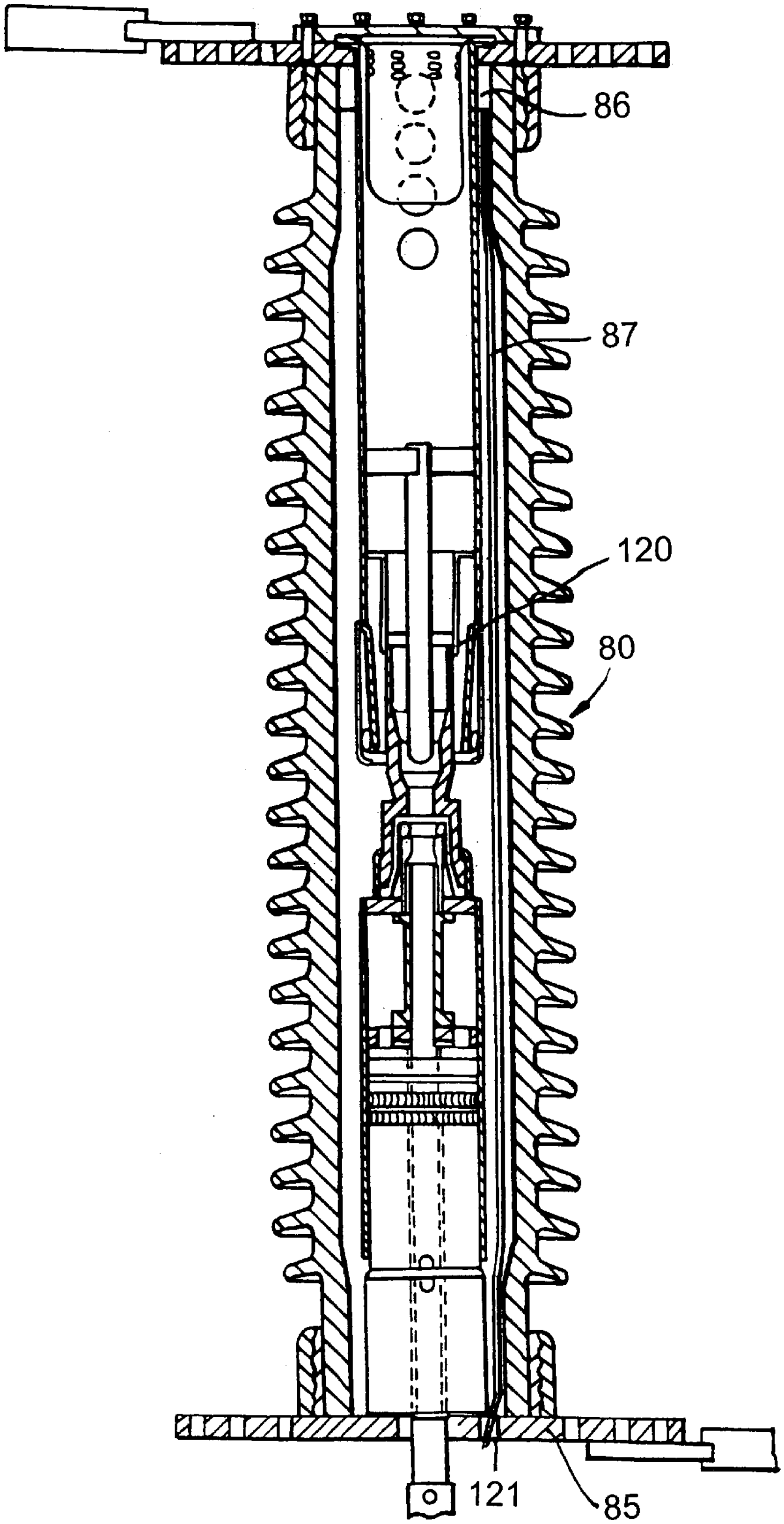
FIG. 13 is a schematic view of another embodiment of the pole according to the invention.

FIG. 13 illustrates an alternative embodiment of the pole according the invention, in which the optical current sensor 86 is arranged around the structure of the fixed contact 120 of the circuit breaker. In this case, the optical cable 87 is made to slide along the entire interruption chamber 80 and passes through the flange 85 by virtue of the through hole 121.

Figure 14:
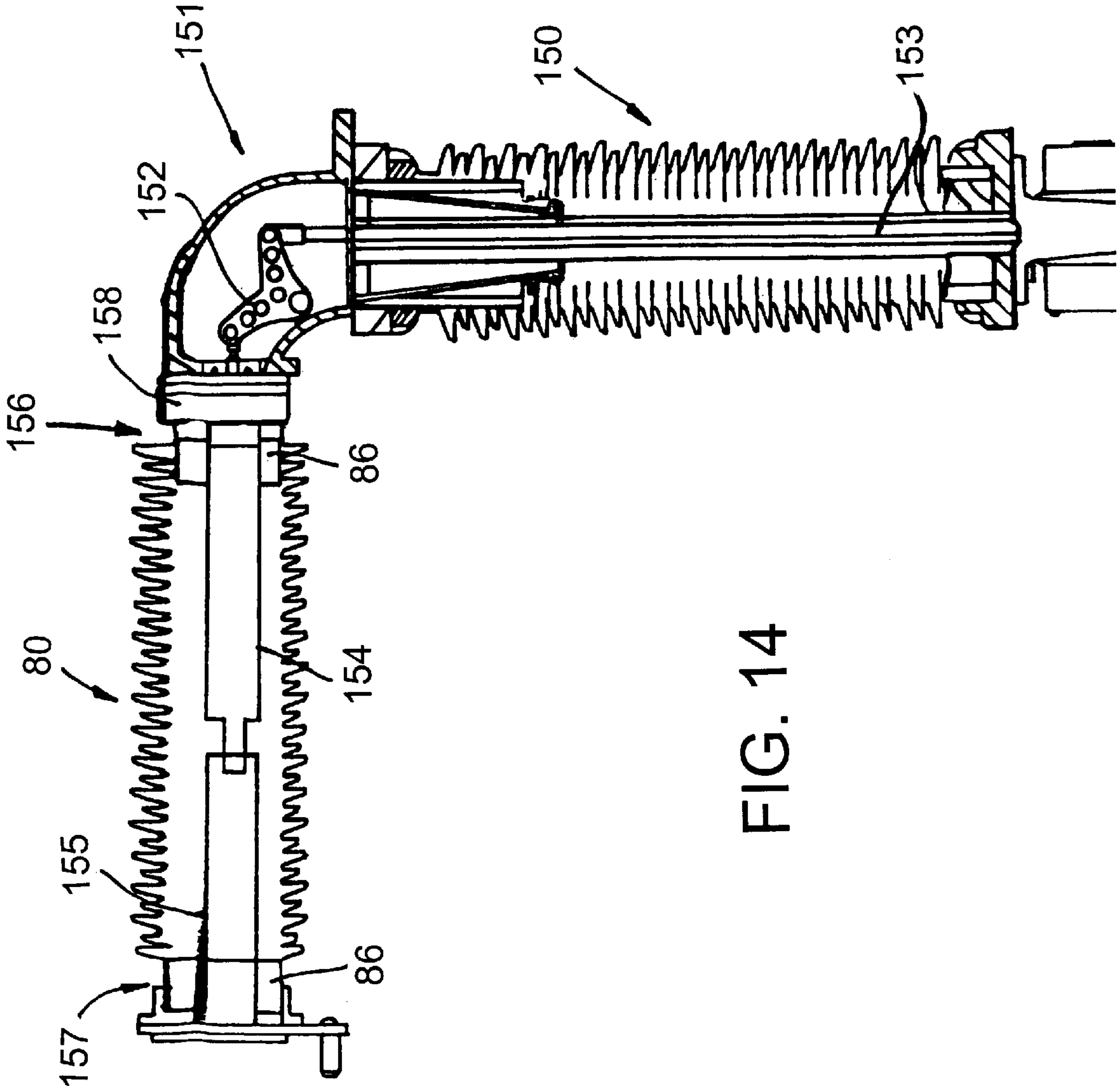
FIG. 14 is a schematic view of another embodiment of the pole according to the invention.

FIG. 14 illustrates a further embodiment of the pole according the invention. The interruption chamber 80 is arranged substantially horizontal and is mechanically connected to a curved chamber 151 which is arranged on an insulating housing 150.

The chamber 151 accommodates mechanisms 152 for transmitting motion between a main actuation rod 153 and the actuation rod of the moving contact 154 arranged inside the interruption chamber 80. Said interruption chamber 80 also accommodates a fixed contact 155 of the circuit breaker. According to this embodiment, the optical current sensor 86 is arranged inside the chamber 80. The arrangements designated respectively by the arrows 156 and 157 appear to be particularly advantageous from the constructive point of view. The arrangement indicated by the arrow 157 provides for the placement of the sensor at the fixed contact 155 of the circuit breaker inside the chamber 80.

The arrangement indicated by the arrow 156 instead provides for the placement, inside the chamber 80, of the optical current sensor 86 at a flange 158 between the interruption chamber 80 and the chamber 151.

Figure 15:
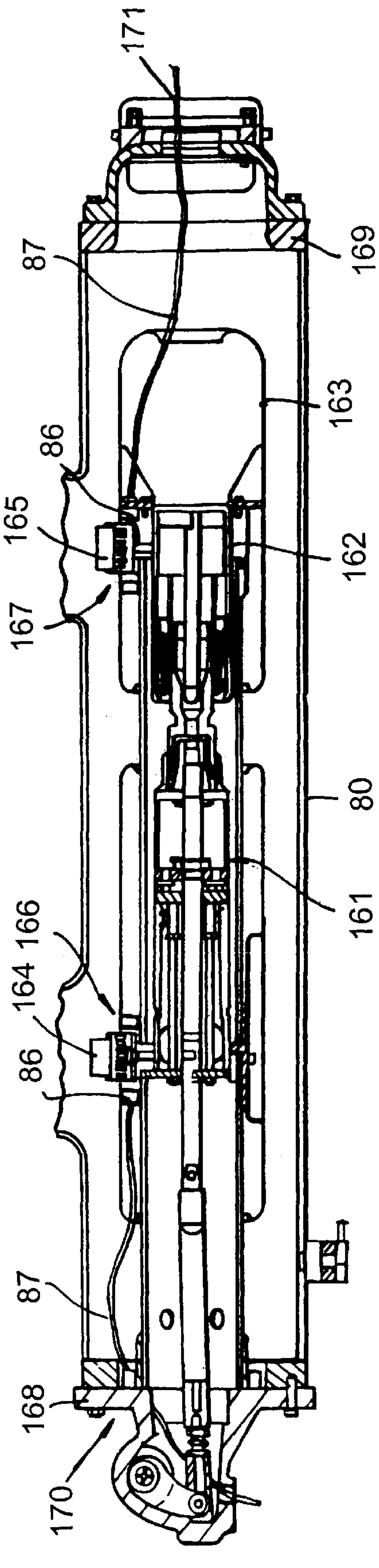
FIG. 15 is a schematic view of another embodiment of the pole according to the invention.

FIG. 15 is a view of another embodiment of the invention.

According to this embodiment, an interruption chamber 80 of the circuit breaker is used in a metal-clad structure; it comprises a moving contact 161, a fixed contact 162 and field shields 163 which completely surround the moving contact 161 and the fixed contact 162.

The current of the circuit breaker passes through connections 164 and 165 after passing through the moving contact 161 and the fixed contact 162.

The optical current sensor 86 is arranged inside the interruption chamber 80 proximate to one of the connections 164 in the position indicated by the arrow 166. As an alternative the optical current sensor 86 can be arranged proximate to the connection 165 in the position indicated by the arrow 167, or it is also possible to use two optical current sensors arranged at both connections 164 and 165.

The optical cable 87 slides along the interruption chamber and passes through the flanges 168 and 169 through the through holes 170 and 171.

Figure 16:
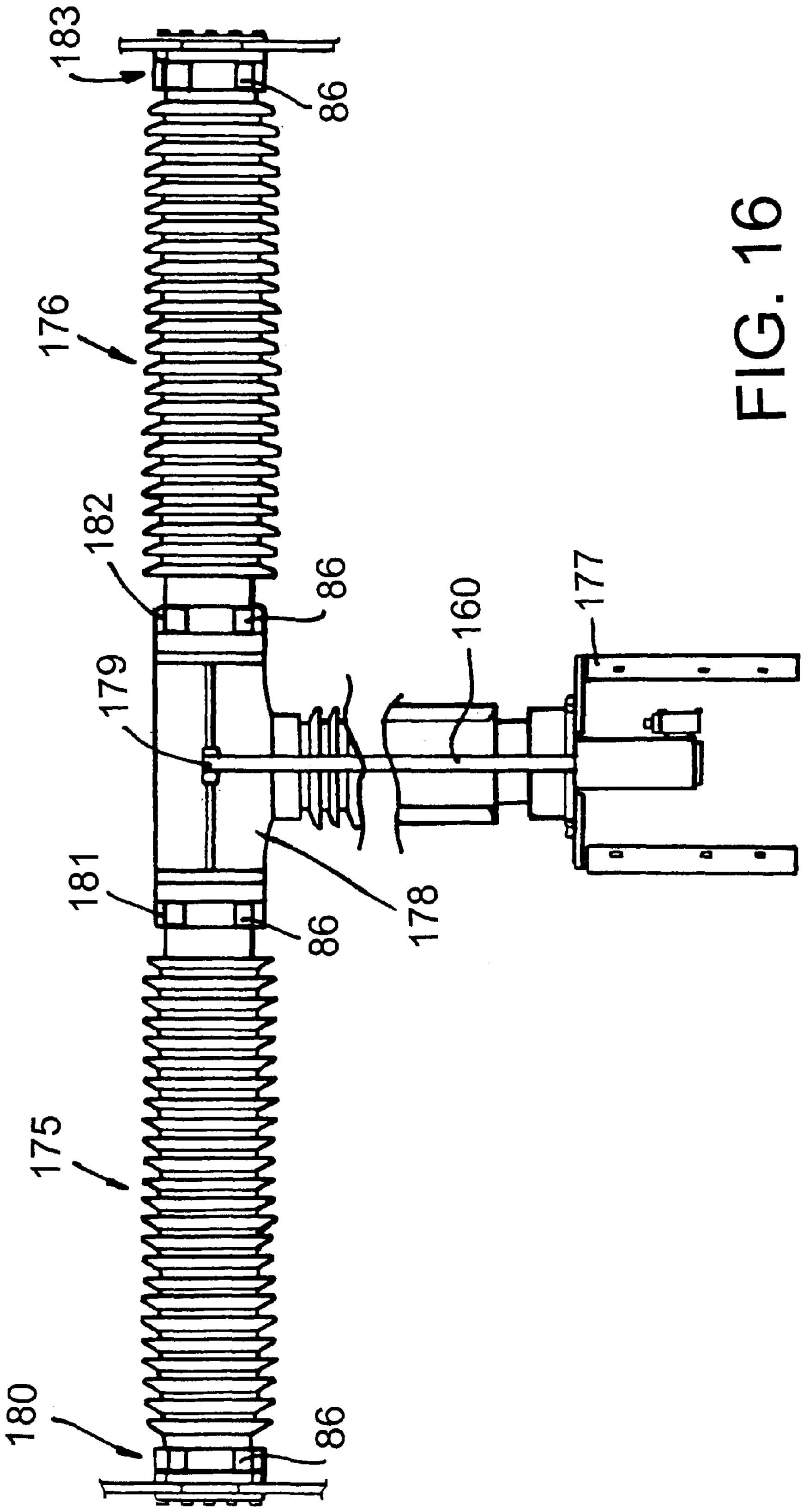
FIG. 16 is a schematic view of another embodiment of the pole according to the invention.

FIG. 16 illustrates another embodiment of the pole according to the invention.

The electrical pole has two interruption chambers 175 and 176 which are arranged substantially horizontal and contain at least one moving contact and one fixed contact.

The two chambers 175 and 176 are connected to a support 177 by means of a chamber 178 which contains elements 179 for transmitting motion between a main actuation rod 160 of the circuit breaker and the moving contacts inside the chambers 175 and 176.

The optical sensor 86 can be arranged inside the structure of each interruption chamber. The arrangements designated by arrows 180, 181, 182 and 183 appear to be particularly advantageous and can occur by using one or more optical current sensors.

In practice it has been found that the electrical pole of high- and/or medium-voltage grids according to the invention fully achieves the intended aim, since it allows to measure the current of a circuit breaker by using an optical sensor, said optical sensor being integrated in the structure of the pole itself inside the volume occupied by the dielectric gas.

The non-ideal current measurement problems typical of the use of current transformers which use windings on a core of magnetic material are furthermore advantageously solved by virtue of the use of an optical current sensor.

The insertion of the optical sensor integrally with respect to the structure of the pole occurs with a limited number of components and with a limited number of mechanical processes. The pole according to the invention is furthermore easy to assemble, with a considerable reduction in installation costs.

It has furthermore been found that the pole according to the invention allows a considerable reduction in the space occupation of the electric pole, with a considerable reduction in operating costs.

Another advantage of the pole according to the invention arises from the fact that the connection between the optical current sensor and the control electronics occurs with a very small number of connections.

This fact, together with the limited number of components used to provide the pole according to the invention, allows a considerable reduction in maintenance costs.

The pole thus conceived is susceptible of numerous modifications and variations, all of which are within the scope of the inventive concept; all the details may furthermore he replaced with other technically equivalent elements. In practice, the materials used, so long as they are compatible with the specific use, as well as the dimensions, may be any according to the requirements and the state of the art.

What is claimed is:

1. A pole of a high- and/or medium-voltage circuit breaker, comprising an insulating housing, at least one interruption chamber which is positioned inside the insulating housing and contains at least a moving contact and at least a fixed contact, a device for measuring the electric current flowing through the pole, and a dielectric gas, wherein said device for measuring the electric current flowing through the pole comprises an optical current sensor arranged within a volume of the pole that is occupied by the dielectric gas, a control system which sends light waves to said optical current sensor, and transmission means connecting the control system to the optical current sensor along which said light waves travel.

2. A pole of a high- and/or medium-voltage circuit breaker, according to claim 1, characterized in that said optical current sensor (86) comprises an optical fiber (99) as transmission medium.

3. A pole of a high- and/or medium-voltage circuit breaker, according to claim 2, characterized in that said transmission medium is positioned in a mechanically insulating means and is arranged inside a seat (100) made of non-conducting material.

4. A pole of a high- and/or medium-voltage circuit breaker, according to claim 1, characterized in that the optical current sensor (86) is arranged inside the interruption chamber (80).

5. A pole of a high- and/or medium-voltage circuit breaker according to claim 1, characterized in that said optical current sensor (86) is located proximate to the fixed contact (120) of said circuit breaker.

6. A pole of a high- and/or medium-voltage circuit breaker according to claim 1, characterized in that said optical current sensor (86) is arranged on a ring (110) which is placed in an intermediate position of said interruption chamber (80).

7. A pole of a high- and/or medium-voltage circuit breaker according claim 1, characterized in that said optical current sensor (86) is arranged at the moving contact on a flange (85) which separates said interruption chamber (80) from the rest of the body of the pole.

8. A pole of a high- and/or medium-voltage circuit breaker according to claim 1, comprising a metal-clad structure and one or more electrical connections (164, 165) characterized in that said optical current sensor (86) is arranged proximate to said one or more electrical connections (164, 165).

9. A pole of a high- and/or medium-voltage circuit breaker according claim 1, comprising a plurality of interruption chambers (175, 176), characterized in that said optical current sensor (86) is arranged inside the structure of at least one of said interruption chambers (175, 176).

10. A pole of a high- and/or medium-voltage circuit breaker according to claim 1, characterized in that said optical current sensor (86) is arranged on a layer of mechanically isolating material.

11. A pole of high- and/or medium-voltage circuit breaker according to claim 1, characterized in that said control system comprises light polarization systems, a gyroscopic measurement system and a signal processing system.

12. A pole of high- and/or medium-voltage circuit breaker according to claim 1, characterized in that said control system is arranged at a relatively large distance from said pole.

13. A pole of high- and/or medium-voltage circuit breaker according to claim 1, characterized in that said control system is arranged in a chamber which is adjacent to the body of said pole.

14. A pole of a high- and/or medium-voltage circuit breaker according to claim 13, characterized in that said chamber that contains said control system (92) is rigidly coupled to the body of said pole and is filled with a dielectric gas.

15. A pole of high- and/or medium-voltage circuit breaker according to claim 1, characterized in that said transmission cable is arranged inside the structure of said pole for at least one part of its length.

16. A pole of high- and/or medium-voltage circuit breaker according to claim 1, characterized in that said transmission cable is an optical transmission cable which contains one or more optical fibers immersed in a protective means.

17. A pole of a high- and/or medium-voltage circuit breaker, according to claim 1, characterized in that said optical current sensor (86) comprises an optical crystal as transmission medium.

18. A substation for high- and/or medium-voltage distribution and/or transmission grids, characterized in that it comprises a pole of a circuit breaker according to claim 1.

* * * * *